United States Patent
Sakata et al.

(10) Patent No.: US 9,779,978 B2
(45) Date of Patent: Oct. 3, 2017

(54) METHOD OF MANUFACTURING SEMICONDUCTOR DEVICE AND SEMICONDUCTOR MANUFACTURING APPARATUS

(71) Applicant: KABUSHIKI KAISHA TOSHIBA, Tokyo (JP)

(72) Inventors: Atsuko Sakata, Mie (JP); Kei Watanabe, Mie (JP); Junichi Wada, Mie (JP); Masayuki Kitamura, Mie (JP); Takeshi Ishizaki, Aichi (JP); Shinya Okuda, Mie (JP); Hirotaka Ogihara, Mie (JP); Satoshi Wakatsuki, Mie (JP); Daisuke Ikeno, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/751,603

(22) Filed: Jun. 26, 2015

(65) Prior Publication Data
US 2016/0276204 A1    Sep. 22, 2016

(30) Foreign Application Priority Data
Mar. 16, 2015   (JP) .................................. 2015-051953

(51) Int. Cl.
*H01L 21/687* (2006.01)
*H01L 21/02* (2006.01)
(Continued)

(52) U.S. Cl.
CPC ...... *H01L 21/68764* (2013.01); *C23C 14/568* (2013.01); *C23C 16/4409* (2013.01);
(Continued)

(58) Field of Classification Search
CPC ................................................. H01L 21/68764
See application file for complete search history.

(56) References Cited

U.S. PATENT DOCUMENTS

| | | | | |
|---|---|---|---|---|
| 6,063,244 A | * | 5/2000 | Pinarbasi | B82Y 10/00 204/192.11 |
| 6,488,984 B1 | * | 12/2002 | Wada | C23C 18/08 118/300 |

(Continued)

FOREIGN PATENT DOCUMENTS

JP        2009-065068        3/2009

*Primary Examiner* — Fernando L Toledo
*Assistant Examiner* — Valerie N Newton
(74) *Attorney, Agent, or Firm* — Finnegan, Henderson, Farabow, Garrett & Dunner, L.L.P.

(57) ABSTRACT

A method of manufacturing a semiconductor device uses a semiconductor manufacturing apparatus including a turn table allowing placement of at least first and second semiconductor substrates and being capable of moving positions of the first and the second semiconductor substrates by turning, a first film forming chamber, and a second film forming chamber. The first and the second film forming chambers are provided with an opening capable of loading and unloading the first and the second semiconductor substrates by lifting and lowering the first and the second semiconductor substrates placed on the turn table. The method includes transferring the first and the second semiconductor substrates between the first and the second film forming chambers by turning the turn fable and lifting and lowering the first and the second semiconductor substrates placed on the turn table; and forming a stack of films above the first and the second semiconductor substrates.

16 Claims, 12 Drawing Sheets

(51) Int. Cl.
    *C23C 16/458*     (2006.01)
    *H01L 21/67*     (2006.01)
    *H01L 21/677*     (2006.01)
    *H01J 37/32*     (2006.01)
    *C23C 14/56*     (2006.01)
    *C23C 16/44*     (2006.01)
    *C23C 16/54*     (2006.01)

(52) U.S. Cl.
    CPC .......... *C23C 16/4585* (2013.01); *C23C 16/54* (2013.01); *H01J 37/32733* (2013.01); *H01J 37/32899* (2013.01); *H01L 21/02175* (2013.01); *H01L 21/02244* (2013.01); *H01L 21/02266* (2013.01); *H01L 21/02271* (2013.01); *H01L 21/6719* (2013.01); *H01L 21/67161* (2013.01); *H01L 21/67745* (2013.01); *H01L 21/67757* (2013.01); *H01L 21/68742* (2013.01); *H01L 21/68771* (2013.01)

(56) References Cited

U.S. PATENT DOCUMENTS

| | | |
|---|---|---|
| 8,399,353 B2 | 3/2013 | Ishizaka et al. |
| 2007/0215036 A1* | 9/2007 | Park .................. C23C 16/45551 117/88 |
| 2012/0222615 A1* | 9/2012 | Kato ................. H01L 21/68764 118/719 |
| 2013/2303250 | 8/2013 | Ishizaka et al. |

\* cited by examiner

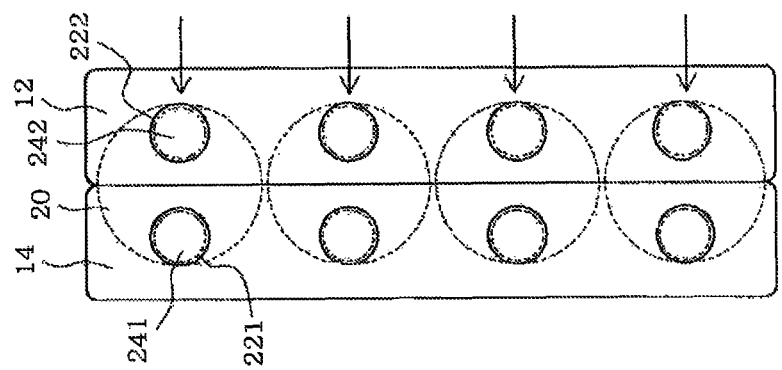
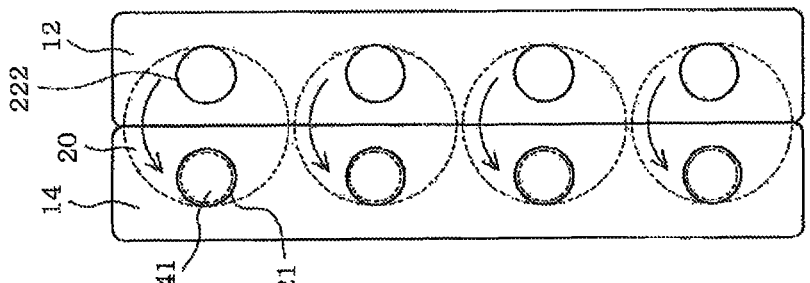
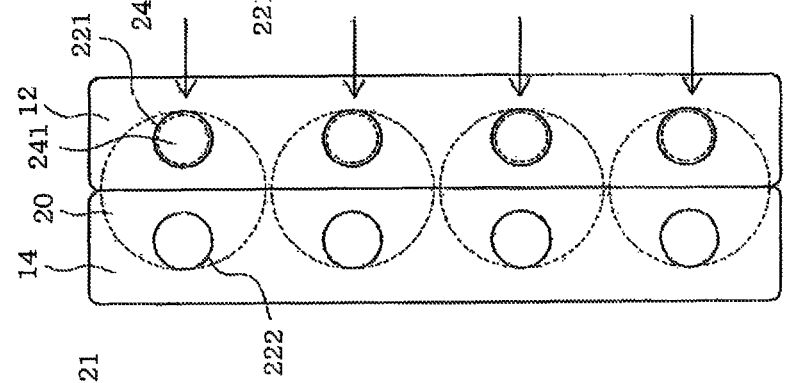
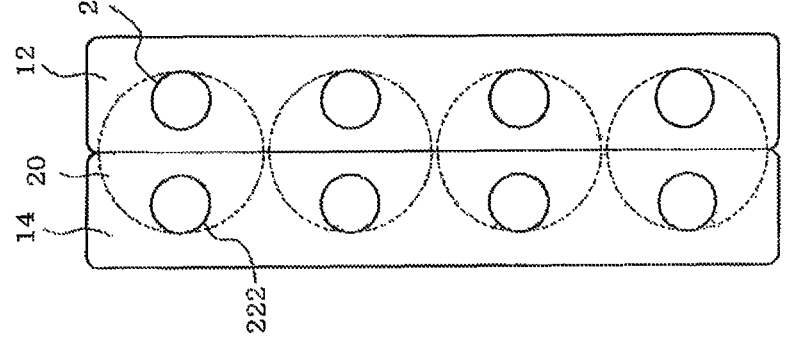

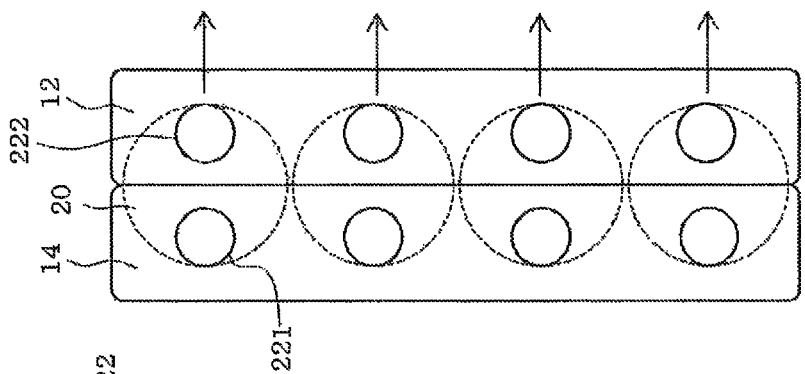
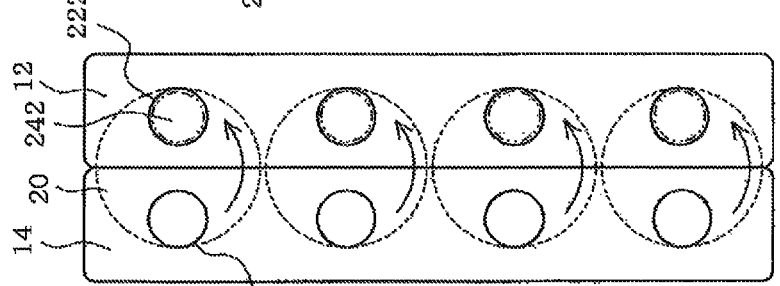
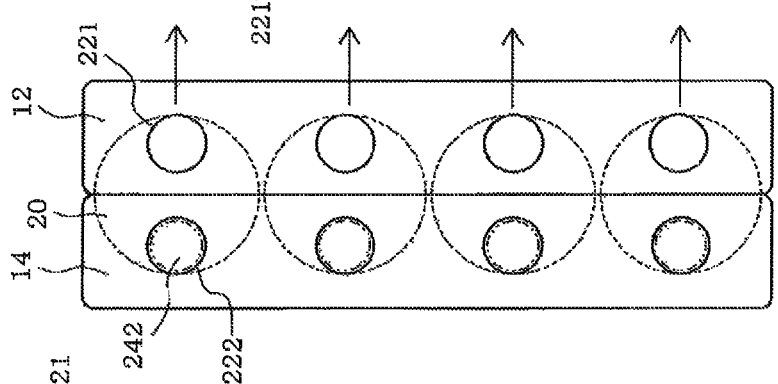
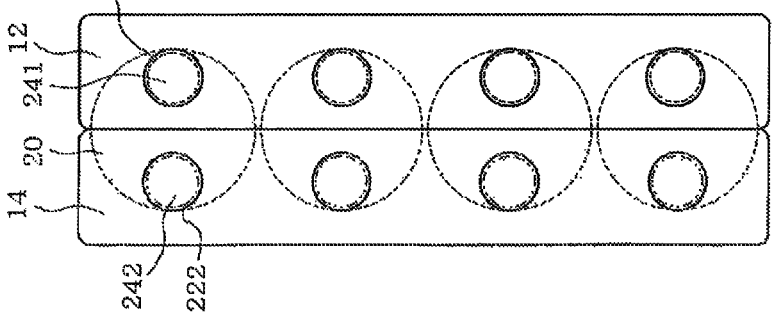

METHOD OF MANUFACTURING SEMICONDUCTOR DEVICE AND SEMICONDUCTOR MANUFACTURING APPARATUS

CROSS-REFERENCE TO RELATED APPLICATION(S)

This application is based upon and claims the benefit of priority from Japanese Patent Application No. 2015-051953, filed on, Mar. 16, 2015 the entire contents of which are incorporated herein by reference.

FIELD

Embodiments disclosed herein generally relate to a method of manufacturing semiconductor device and a semiconductor manufacturing apparatus.

BACKGROUND

In manufacturing a semiconductor device having a three-dimensional structure, two or more types of films are often formed repeatedly to obtain a multilayered structure. It is difficult to improve process throughput in cases, for example, where the films are formed by different methods such as sputtering and CVD (Chemical Vapor Deposition), where the films are formed under different pressures such as in sputtering of oxides and in sputtering of metals, or where it is not preferable to expose two types of targets for example to the same ambient.

BRIEF DESCRIPTION OF THE DRAWINGS

FIGS. 6A, 6B, 6C, and 6D are examples of views for explaining the movement of the turn tables and the semiconductor substrates at the start of a film formation process.

FIGS. 7A, 7B, 7C, and 7D are examples of view for explaining the movement of the turn tables and the semiconductor substrates at the end of film formation.

DESCRIPTION

Figure 1A:
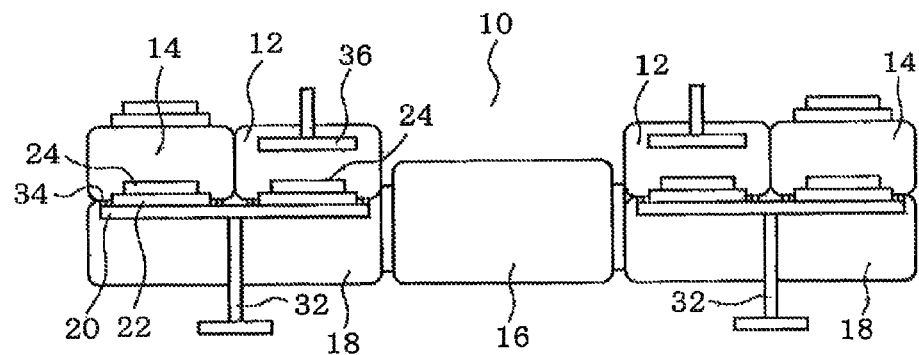
FIG. 1A pertains to a first embodiment and is one example of a vertical cross-sectional view illustrating the structure of a semiconductor manufacturing apparatus.

In one embodiment, a method of manufacturing a semiconductor device uses a semiconductor manufacturing apparatus including a turn table configured to allow placement of at least a first semiconductor substrate and a second semiconductor substrate and configured to be capable of moving positions of the first semiconductor substrate and the second semiconductor substrate by turning, a first film forming chamber, and a second film forming chamber, the first film forming chamber and the second film forming chamber each being provided with an opening configured to be capable of loading and unloading the first semiconductor substrate and the second semiconductor substrate by lifting and lowering of the first semiconductor substrate and the second semiconductor substrate placed on the turn table. The method includes transferring the first semiconductor substrate and the second semiconductor substrate between the first film forming chamber and the second film forming chamber by turning the turn table and lifting and lowering the first semiconductor substrate and the second semiconductor substrate placed on the turn table; and forming a stack of films above the first semiconductor substrate and the second semiconductor substrate.

Embodiments are described herein with reference to the accompanying drawings. The drawings are schematic and are not necessarily consistent with the actual relation between thickness and planar dimensions as well as the ratio of thicknesses between different layers, etc. The same element may be illustrated in different dimensions or ratios in different figures. Further, directional terms such as up, down, left, and right are used in a relative context with an assumption that the surface, on which circuitry is formed, of the later described semiconductor substrate faces up and thus, do not necessarily correspond to the directions based on gravitational acceleration. In the drawings referred to in the following description, elements that are identical or similar in function, structure, etc. to those already illustrated or described are identified with identical or similar reference symbols and may not be re-described.

(First Embodiment)

Figure 1B:
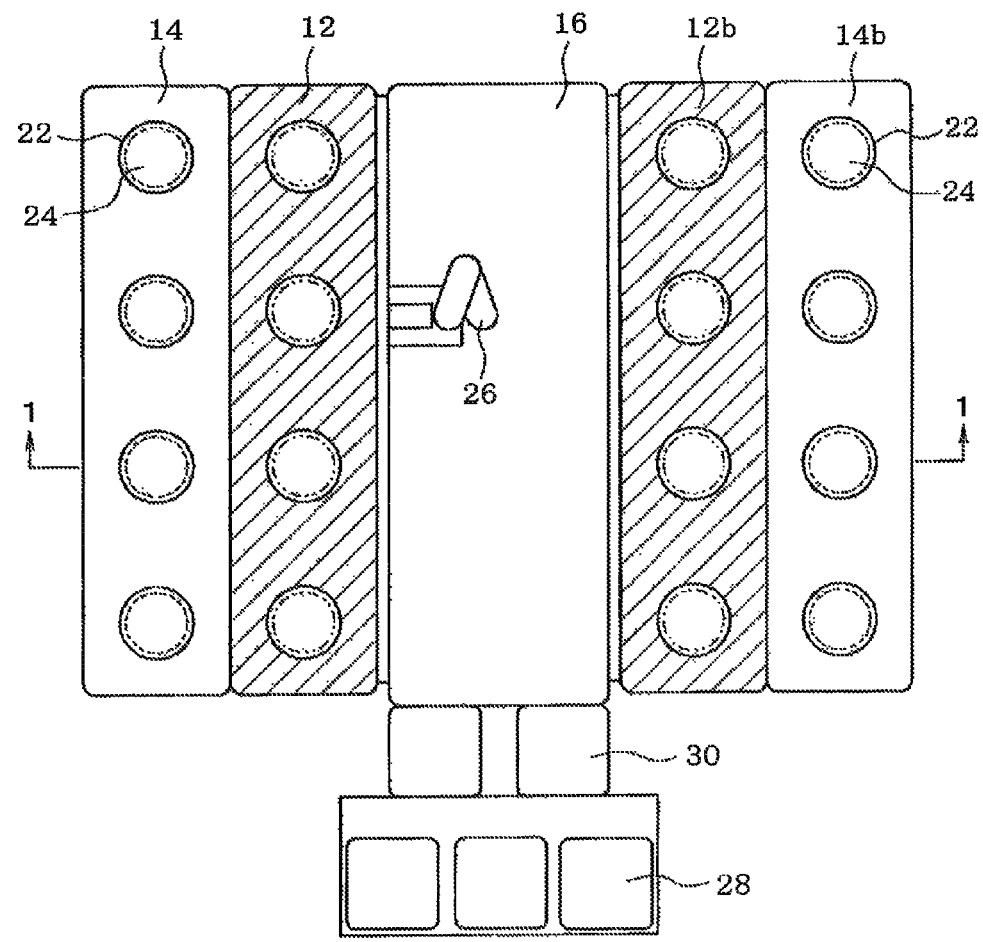
FIG. 1B pertains to the first embodiment and is one example of an upper surface view of the semiconductor manufacturing apparatus.

FIGS. 1A and 1B, FIGS. 2A to 2C, FIGS. 3A to 3C, and FIGS. 4A to 4C pertain to a first embodiment and briefly illustrate semiconductor manufacturing apparatus 10. FIG. 1A is a vertical cross-sectional view taken along line 1-1 of FIG. 1B and illustrates one example of a structure of semiconductor manufacturing apparatus 10 of the first embodiment. FIG. 1B is one example of a top view of semiconductor manufacturing apparatus 10 of the first embodiment.

Semiconductor manufacturing apparatus 10 is configured to be capable of consecutive execution of a film formation process employing different methodologies and/or different conditions. For example, semiconductor manufacturing apparatus 10 is capable of consecutive execution of film formation by PVD (Physical Vapor Deposition) and film formation by CVD (Chemical Vapor Deposition). Transfer chamber 16 is provided in the central portion of semiconductor manufacturing apparatus 10. Transfer chamber 16 is elongated in the up and down direction as viewed in FIG. 1B. First film forming chamber 12 and second film forming chamber 14 are provided in the left side of transfer chamber 16. Similarly, first film forming chamber 12 and second film forming chamber 14 are provided in the right side of transfer chamber 16. First film forming chamber 12 and second film forming chamber 14 provided in each of the left and. right sides of transfer chamber 16 are located so that first film forming chamber 12 is closer to transfer chamber 16. Stated differently, the chambers 12 and 14 are located so as to be line symmetric with respect, to the center of transfer chamber 16 so that first film forming chamber 12 and second film forming chamber 14 are located in the listed sequence to the right side of transfer chamber 16 and first film forming chamber 12 and second film forming chamber 14 are likewise located in the listed sequence to the left side of transfer chamber 16. In this example, first film forming chamber 12 is a CVD apparatus and second film forming chamber 14 is a sputtering apparatus. First film forming chamber 12 and second film forming chamber 14 are structured independently. Any combination of film forming apparatuses is acceptable for first and second film forming chambers 12 and 14. The CVD apparatus and the sputtering apparatus serving as first film forming chamber 12 and second film forming chamber 14 are merely examples and are not to be construed in a limiting sense. For example, a CVD apparatus may be used for both first and second film forming chambers 12 and 14. Likewise, a sputtering apparatus may be used for both first and second film forming chambers 12 and 14.

The first embodiment is described hereinafter through an example in which a CVD apparatus is disposed in the first film forming chamber 12. Various types of source gases are supplied to first film forming chamber 12. Such source gases are supplied at controlled flow rates by a mass flow controller not illustrated and are evenly distributed into chamber 12 through gas distribution plate 36. Gas distribution plate 36 also serves as an RF (Radio Frequency) electrode. Gas distribution plate 36 is disposed so as to face multiple stages. Gas distribution plate 36 is connected to a high-frequency RF power supply and a low-frequency RF power supply (neither of which is shown), or is grounded. When electric power is applied to the RF power supply, electric power is supplied into the space inside chamber 12 to produce plasma. When forming a silicon oxide film ($SiO_2$) for example by first film forming chamber 12, the ambient inside first film forming chamber 12 contains oxidizing gas. In other words, the silicon oxide film is formed, in an oxidizing ambient. Further, when forming films such as polysilicon (Poly Si) film and tungsten (W) film, the ambient inside first film forming chamber 12 contains reduction gas. These materials are oxidizable materials which are oxidized when exposed to oxidizing ambient. When a silicon nitride film (SiN) is formed by CVD, dichlorosilane ($SiH_2Cl_2$) gas, ammonia ($NH_3$) gas, and hydrogen chloride (HCl) gas are used for example as a reaction gas. Because ammonia gas is a reduction gas, formation of the silicon nitride film is interrupted when oxidizing gas is introduced during the formation of the silicon nitride film.

A PVD apparatus is disposed in second film forming chamber 14. In this example, the PVD apparatus is a sputtering apparatus. Examples of metal films which may be formed by sputtering include Al, Co, Cu, Hf, Ir, Mo, Ni, Pd, Pt, Ru, Si, Ta, Ti, and W. Metallic compounds such as WNx, MoNx, NiSix, and NiSiNx may also be formed by sputtering. These metal-containing materials are oxidizable materials that are oxidized when exposed to an oxidizing ambient. When forming these films by sputtering, the interior of second film forming chamber 14 is placed in an ambient of inert gas such as argon or an ambient of non-oxidizing ambient such as nitrogen. In either case, the interior of second film forming chamber 14 may further be vacuumed or depressurized and maintained at low pressure levels. When forming a silicon oxide film for example, the silicon oxide film may be deposited by reactive sputtering using a silicon target with second film forming chamber 14 placed in an oxidizing ambient. Alternatively, the silicon oxide film may be sputter deposited using a SiOx target in an ambient of inert gas such as argon or in an ambient of gas mixture containing Ar and $O_2$ for example. Because films formed in the first film forming chamber 12 and second film forming chamber 14 are different, different film forming conditions are applied to each chamber such as the type of gas being introduced, applied pressure, etc.

Multiple wafer stages 22 may be disposed in first film forming chamber 12 and in second film forming chamber 14. For example, in the first embodiment, first film forming chamber 12 and second film forming chamber 14 are each configured to accommodate four wafer stages 22 disposed in a straight line. A heater is provided inside each wafer stage 22. The temperature of the heater may be controlled to range from approximately 100 degrees Celsius to 700 degrees Celsius. Wafer stage 22 may also be provided with an electrode serving as an electrostatic chuck for preventing wafer displacement.

Both first film forming chamber 12 and second film forming chamber 14 are capable of processing four wafers (semiconductor substrates) 24 at once. In this example, a description is given based on an assumption that four wafer stages 22 can be disposed in each of first film forming chamber 12 and second film forming chamber 14. However, first film forming chamber 12 and second film forming chamber 14 may be configured to accommodate any number of wafer stages 22.

Transition chamber 18 is provided below first film forming chamber 12 and second film forming chamber 14. Turn tables 20 configured to hold wafer stages 22 are disposed in transition chamber 18. Turn table 20 may be round as in the illustration represented by reference symbol 20a in FIG. 5A. Alternatively, turn table 20 may be rectangular as in the illustration represented by reference symbol 20b in FIG. 5B. Wafer stage 22 is configured to allow placement of semiconductor substrate (wafer) 24. FIGS. 1A and 1B illustrate an example in which semiconductor substrate 24 is placed on every wafer stage 22. The interior of transition chamber 18 is depressurized. Turn table 20 is provided with a rotary mechanism not illustrated which is configured to cause rotation of turn table 20 about table shaft 32. The rotary mechanism allows semiconductor substrate 24 located in the left side to be switched over to the right side by rotating/turning turn table 20. Table shaft 32 is provided with a lifting and lowering mechanism to allow lifting and lowering of turn table 20. Using the rotary mechanism and the lifting and lowering mechanism of turn table 20, it is possible to load semiconductor substrate 24 into and unload semiconductor substrate 24 from first film forming chamber 12 and second film, forming chamber 14. It is further possible to transfer or exchange semiconductor substrates 24 between first film forming chamber 12 and second film forming chamber 14 by the use of the rotary mechanism and the lifting and lowering mechanism of turn table 20. More specifically, turn table 20 is lowered by using the lifting and lowering mechanism of table shaft 32. Then, turn table 20 is turned around by the rotary mechanism so that semiconductor substrate 24 located in the right side is switched over to the left side and vice versa, followed by lifting of turn table 20. As a result, it is possible to interchange semiconductor substrates 24 processed in first film forming chamber 12 and in second film forming chamber 14. By repeating the above described sequence, it is possible to efficiently repeat film formation in first film forming chamber 12 and in second film forming chamber 14. First film forming chamber 12, second film forming chamber 14, and transition chamber 18 are placed in a depressurized ambient. Thus, semiconductor substrate 24 is transferred between depressurized spaces. Moreover, since the volume of transition chamber 18 is less than the volume of transfer chamber 16, it is possible to transfer the wafers between the film forming chambers via transition chamber 18 with less time consuming pressure adjustment as compared to the duration of pressure adjustment required when transferring the wafers between the film forming chambers via transfer chamber 16. Further, the provision of transition chamber 18 allows the wafer to be transferred between the wafer chambers without being affected by the degree of vacuum of transfer chamber 16. For example, the wafer may be transferred between the film forming chambers by specifying the pressure inside transition chamber 18 to an intermediate level of the pressure levels of the two film forming chambers.

Openings serving as inlet/outlet for loading and unloading of semiconductor substrates 24 are provided in the bottom surfaces of first film forming chamber 12 and second film forming chamber 14. The outer diameter of each inlet/outlet port is substantially equal to the outer diameter of wafer stage 22. The inlet/outlet ports are each provided with an opening/closing member not illustrated configured to be capable of opening and closing the inlet/outlet port. The inlet/outlet port is closed by the opening/closing member when semiconductor substrate 24 is not being loaded. The inlet/outlet port is opened when semiconductor substrate 24 is being loaded, thereby allowing first film forming chamber 12 and second film forming chamber 14 to accommodate semiconductor substrates 24. Wafer stage 22 has a predetermined thickness. In loading semiconductor substrate 24 through the inlet/outlet port, wafer stage 22 is lifted by turn table 20 and inserted into the inlet/outlet port to close the inlet/outlet port in a substantially airtight state. Further, seal member 34 is provided in each of the under surfaces of first film forming chamber 12 and second film forming chamber 14. Seal member 34 comprises a corrosion-resistant elastic member shaped like a letter O. Seal member 34 is disposed so as to surround the periphery of the inlet/outlet port for semiconductor substrate 24. Seal member 34, placed in structural contact with the upper surface of turn table 24, allows the inlet/outlet port for semiconductor substrate 24 to be covered in a substantially airtight state. It is thus, possible to keep the interiors of first film forming chamber 12 and second film forming chamber 14 in a substantially airtight state during the film forming process. Further, a gas supplier mechanism not illustrated may be provided to wafer stage 22 and turn table 20. The gas supplier mechanism may be configured to discharge inert gas to prevent films from depositing on the under surface and the bevel of the wafer during film formation and to protect the seal member 34.

Arm robot 26 is provided inside transfer chamber 16. Load lock chamber 30 and load port 28 are provided at one end of transfer chamber 16. Arm robot 26 carries semiconductor substrate 24 from load lock chamber 30 to transfer chamber 16 and vice versa. Arm robot 26 further carries semiconductor substrate 24 between transfer chamber 16 and wafer stage 22. The interior of transfer chamber 16 as well as the interior of load lock chamber 30 are depressurized. Semiconductor substrate 24 loaded into load port 28 is transferred to load lock chamber 30 and thereafter carried to transition chamber 18 by arm robot 26. A gate valve not illustrated is provided between transfer chamber 16 and transition chamber 18. The gate valve remains closed except when arm robot 26 places semiconductor substrate 24 on wafer stage 22 disposed inside transition chamber 18 or when arm robot 26 removes semiconductor substrate 24 from transition chamber 18.

First film forming chamber 12 and second film forming chamber 14 are each provided with an exhaust system not illustrated. The exhaust system is connected to components such as a dry pump and a turbo molecular pump. The exhaust system may further be connected to a cryo pump which is hooked up independently of the dry pump. A pressure control valve may be provided between each of the different types of pumps and first and second film forming chambers 12 and 14 to perform more elaborate control of pressure.

Still further, an exhaust system configured by components such as a dry pump may be provided in transfer chamber 16 and load lock chamber 30. First film forming chamber 12 and second film forming chamber 14 may share the same exhaust system or have separate exhaust systems. Separate exhaust systems would allow independent control of pressure. The pressures inside first film forming chamber 12 and second film forming chamber 14 are controlled so as to be greater than the pressure inside transition chamber 18 to prevent gas transfer. Such relatively greater pressure levels inside first film forming chamber 12 and second film forming chamber 14 may be achieved, for example, by introducing inert gas such as argon into first film forming chamber 12 and second film forming chamber 14.

In the structure described above, it is possible to perform repeated alternate execution of film formation in first film forming chamber 12 and second film forming chamber 14 by simply interchanging semiconductor substrate 24 located in the left side with semiconductor substrate 24 located in the right side and vice versa. It is further possible to move semiconductor substrates 24 between first film forming chamber 12, second film forming chamber 14, and transition chamber 18 without purging to the atmospheric pressure level, or depressurizing from the atmospheric pressure level, etc since chambers 12, 14, 18 are placed in a depressurized ambient. It is thus, possible to improve process throughput.

It is further possible to interchange the left-side and right-side positions of semiconductor substrates 24 within the vacuumed or depressurized transition chamber 18. This also contributes to improved process throughput. It is further possible to prevent remnant gases in first film forming chamber 12 and second film forming chamber 14 from flowing into one another when semiconductor substrates 24 are being interchanged since the pressures inside first film forming chamber 12 and second film forming chamber 14 are controlled to be greater than the pressure inside transition chamber 18. This is explained through an example in which a silicon oxide film is formed in an oxidizing ambient in first film forming chamber 12 and tungsten (W) is formed by sputtering in second film forming chamber 14. In this example, intrusion of oxidizing gas into second film, forming chamber 14 will oxidize W which is an example of an oxidizable material. Since the remnant gases in the first film forming chamber 12 and second film forming chamber 14 are restricted from flowing into one another in the first embodiment, oxidation of W formed in second film forming chamber 14 as well as the oxidation of the surface of the target can be inhibited. It is thus, possible to form good W film.

As a result, it is possible to provide a semiconductor manufacturing apparatus capable of forming film stacks at high throughput by preventing transfer of remnant gases between the chambers even when first film forming chamber 12 and second film forming chamber 14 operate in different pressure regions such as in PVD and CVD, or when executing two different types of film forming processes such as formation of oxide films and sputtering of metal films which are preferably not carried out in the same ambient. For example, when forming an oxide film in first film forming chamber 12, first film forming chamber 12 is placed in an oxidizing ambient. In contrast, when a metal film is formed by sputtering for example in second film forming chamber 14, intrusion of the oxidizing ambient inside first film forming chamber 12 into second film forming chamber 14 causes oxidation of the metal film. As a result, the oxidized metal film may not exhibit the desired conductivity for example. Gas transfer between first film forming chamber 12 and second film forming chamber 14 is inhibited in the first embodiment and thus, it is possible to prevent problems such as those described above.

Combinations of film formation processes carried out in the semiconductor manufacturing apparatus include for example, forming a silicon oxide film in first film forming chamber 12 by CVD in an oxidizing ambient and forming a tungsten film in second film forming chamber 14 by sputtering. Alternatively, silicon oxide film may be formed in first film forming chamber 12 by CVD in an oxidizing ambient and tungsten film may be formed in second film forming chamber 14 by CVD as well. In the alternative example, both first film forming chamber 12 and second film forming chamber 14 serve as a CVD apparatus. In another example, a polysilicon film may be formed in first film forming chamber 12 or in second film forming chamber 14 by CVD. Any combination of film forming methods may be employed in first film forming chamber 12 and second film forming chamber 14. The term CVD apparatus includes a thermal CVD apparatus, a plasma CVD apparatus, or the like, as well as an ALD (Atomic Layer Deposition) apparatus.

Next, a description will be given on the operation of the first embodiment with reference to FIGS. 2A to 2C, 3A to 3C, and 4A to 4C. Reference will also be made to FIG. 1 as required. The semiconductor substrate illustrated in the right side as viewed in FIG. 2A will be referred to as semiconductor substrate 241. The wafer stage carrying semiconductor substrate 241 illustrated in the right side of FIG. 2A will be referred to as wafer stage 221. The wafer stage not carrying a semiconductor substrate illustrated in the left side of FIG. 2A will be referred to as wafer stage 222. As later described, the semiconductor substrate placed on wafer stage 222 will be referred to as semiconductor substrate 242. A description will be given hereinafter through an example in which a silicon oxide film is formed by CVD in first film forming chamber 12 and tungsten film is formed by sputtering in second film forming chamber 14.

Figure 2A:
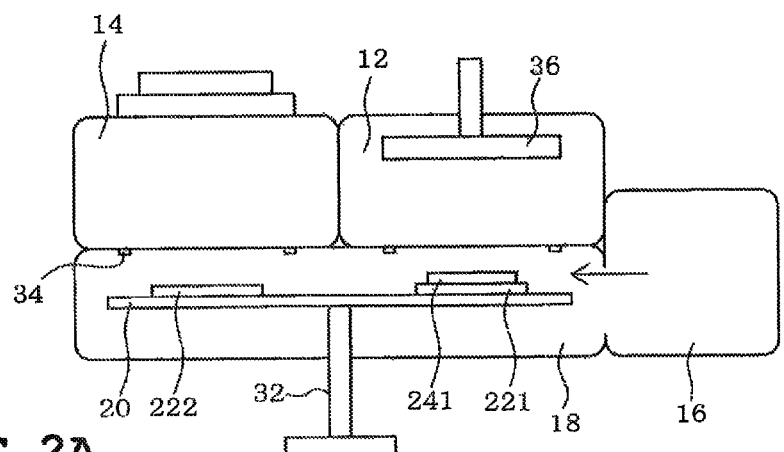
FIGS. 2A, 2B, and 2C are examples of views illustrating the operation of the first embodiment.

First, adjustment is made in the alignment of semiconductor substrate 241 using a wafer aligner provided in load lock chamber 30. Semiconductor substrate 241 is thereafter transferred to arm robot 26 of transfer chamber 16. At this stage, each of the processing chambers are standing by for the start of the film forming process. Then, using arm robot 26, semiconductor substrate 241 is placed, on wafer stage 221 disposed on turn table 20 as illustrated in FIG. 2A. In this example, four wafer stages 221 are disposed in first film forming chamber 12 as illustrated in FIG. 1B and thus, semiconductor substrate 241 is placed on each of the four wafer stages 221.

Figure 2B:
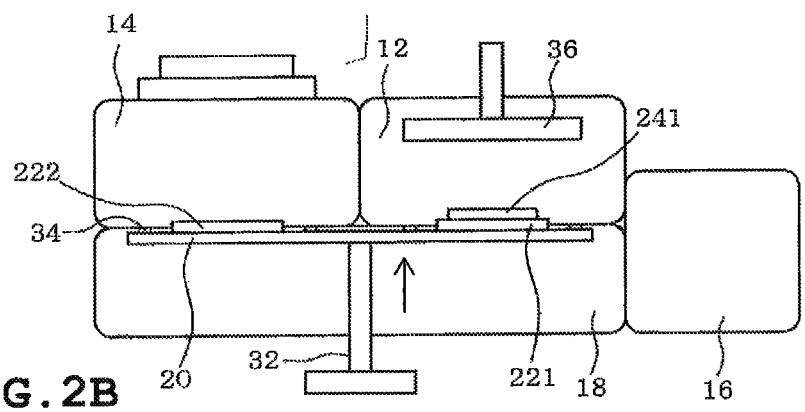

Referring next to FIG. 2B, turn table 20 is lifted by the lifting and lowering mechanism of table shaft 32 to place semiconductor substrates 241 inside first film forming chamber 12. The interior of first film forming chamber 12 is kept substantially airtight by wafer stage 221 and seal member 34. Then, a CVD film is formed above each semiconductor substrate 241 by executing a film forming process in first film forming chamber 12. In this example, a silicon oxide film is formed along the surface of each semiconductor substrate 241. Meanwhile, nothing is carried out in second film forming chamber 14.

Figure 2C:
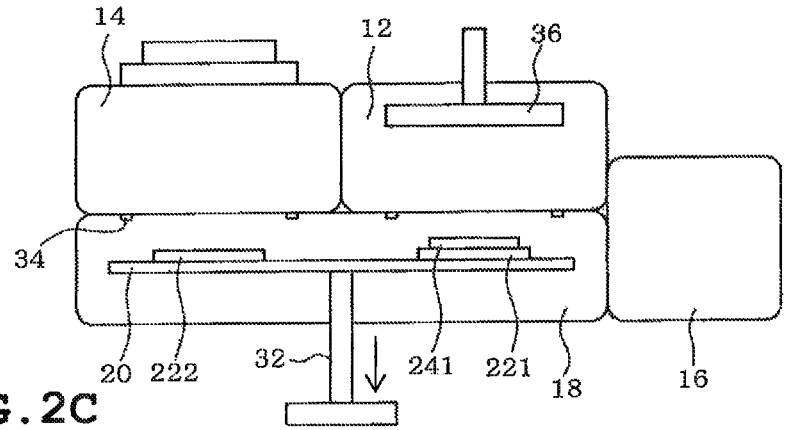
Figure 3A:
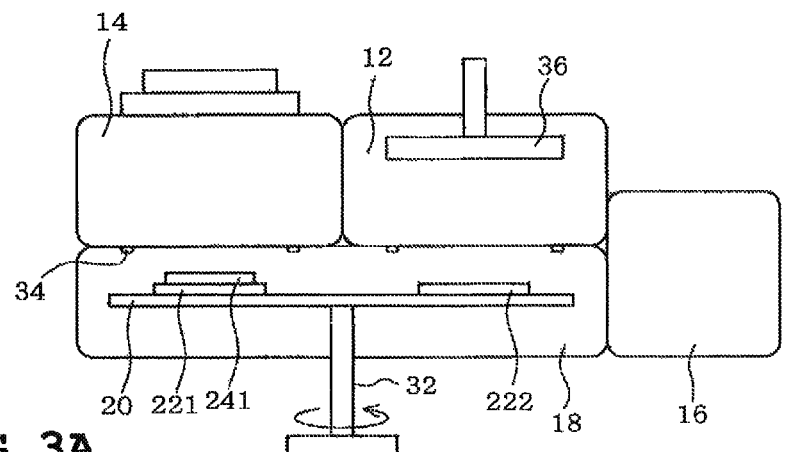
FIGS. 3A, 3B, and 3C are examples of views illustrating the operation of the first embodiment.

Referring next to FIG. 2C, turn table 20 is lowered using the lifting and lowering mechanism of table shaft 32. Referring next to FIG. 3A, turn table 20 is turned 180 degrees using the rotation mechanism of table shaft 32 and wafer stages 221 and the overlying semiconductor substrates 241 are moved below second film forming chamber 14. At the same time, wafer stages 222 are moved below first film forming chamber 12. The locations of wafer stages 221 and 222 are interchanged in the above described manner.

Figure 3B:
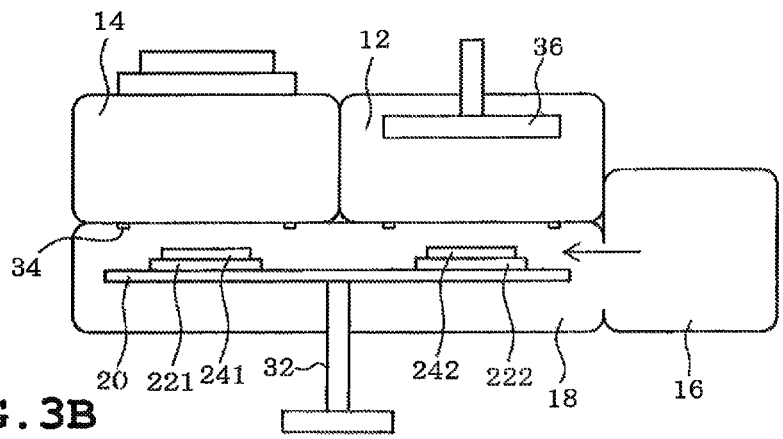

Referring next to FIG. 3B, semiconductor substrate 242 is placed wafer stage 222 provided on turn table 20 by arm robot 26. In this example, four wafer stages 222 are disposed below first film forming chamber 12 as illustrated in FIG. 1B and thus, semiconductor substrate 242 is placed on each of the four wafer stages 222.

Figure 3C:
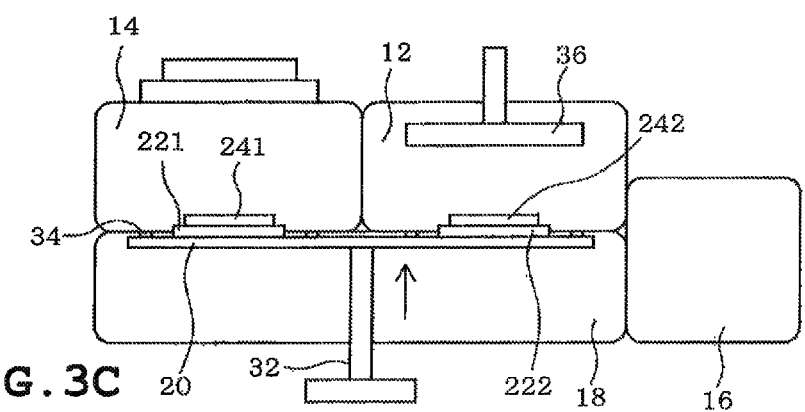

Referring next to FIG. 3C, turn table 20 is lifted by the lifting and lowering mechanism of table shaft 32 to place semiconductor substrates 242 inside first film forming chamber 12 and semiconductor substrates 241 inside second film forming chamber 14. The interior of first film forming chamber 12 and second film forming chamber 14 are kept substantially airtight by wafer stages 221 and 222 and by seal members 34. Then, a CVD film is formed above each semiconductor substrate 242 by executing a film forming process in first film forming chamber 12 and PVD film is formed above each semiconductor substrate 241 by executing a film forming process in second film forming chamber 14. Thus, a stack of a first CVD film and a first PVD film are formed above each semiconductor substrate 241, whereas a first CVD film is formed above each semiconductor substrate 242. In first film forming chamber 12, a silicon oxide film is formed by CVD above each semiconductor substrate 242. In second film forming chamber 14, a W film is formed by sputtering above each semiconductor substrate 241.

Figure 4A:
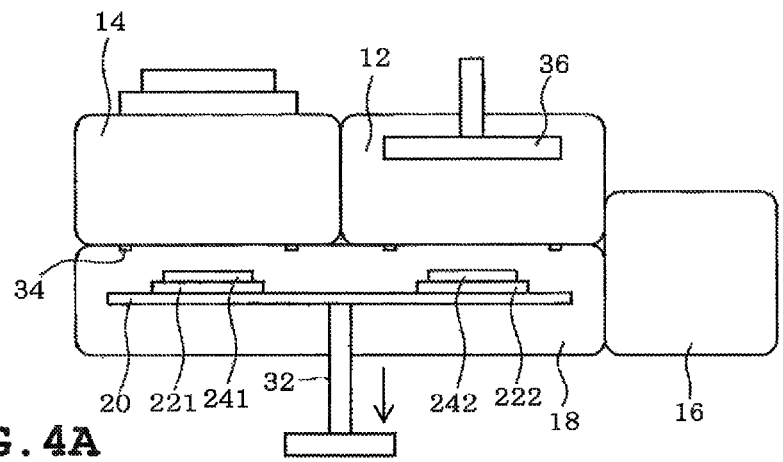
FIGS. 4A, 4B, and 4C are examples of views illustrating the operation of the first embodiment.
Figure 4B:
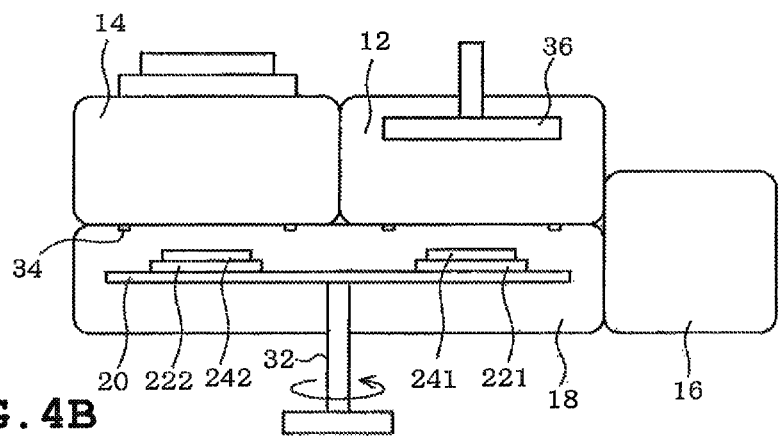
Figure 4C:
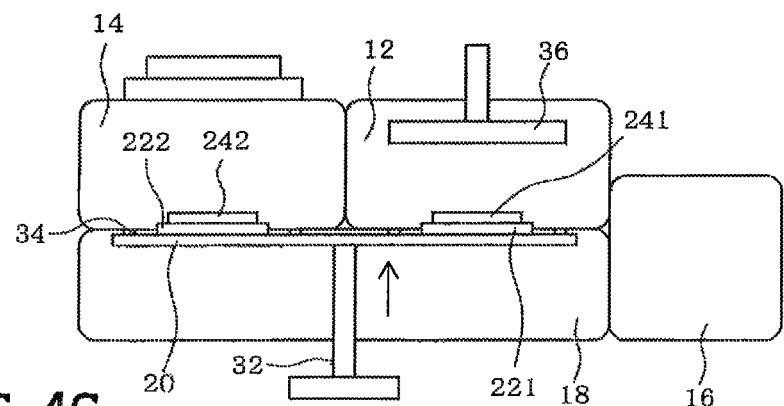

Referring next to FIG. 4A, turn table 20 is lowered by lifting and lowering mechanism of table shaft 32. Referring next to FIG. 4B, turn table 20 is turned using the rotation mechanism of table shaft 32 to interchange the locations of wafer stages 221 and 222. Thus, wafer stages 221 and the overlying semiconductor substrates 241 are located below first film forming chamber 12 and wafer stages 222 and the overlying semiconductor substrates 242 are located below second film forming chamber 14. Referring next to FIG. 4C, turn table 20 is lifted by the lifting and lowering mechanism of table shaft 32 to place semiconductor substrates 241 inside first film forming chamber 12 and semiconductor substrates 242 inside second film forming chamber 14. Then, a CVD film is formed above each semiconductor substrate 241 by executing a film forming process in first film forming chamber 12 and PVD film is formed above each semiconductor substrate 242 by executing a film forming process in second film forming chamber 14. In first film forming chamber 12, a silicon oxide film is formed above each semiconductor substrate 241. In second film forming chamber 14, a W film is formed above each semiconductor substrate 242.

As a result, a stack of a first CVD film, a first PVD film, and a second CVD film are formed above semiconductor substrate 241. In this example, a stack of a silicon oxide film, a W film, and a silicon oxide film are formed above semiconductor substrate 241. A stack of a first CVD film and a first PVD film are formed above semiconductor substrate 242. In this example, a stack of a silicon oxide film and a W film are formed above semiconductor substrate 242.

This is repeated hereinafter to form desired layers of CVD films and PVD films above semiconductor substrate 241 and semiconductor substrate 242. In this example, 120 layers of silicon oxide films and W films are stacked above semiconductor substrates 241 and 242.

After completing the film forming process, semiconductor substrates 241 and 242 are carried to transfer chamber 16 by arm robot 26 and subsequently returned to load lock chamber 30. The semiconductor substrates having been subjected to the above described film forming process and stored in load lock chamber 30 are thereafter transferred to load port 28 and removed from semiconductor manufacturing apparatus 10. The processing of the semiconductor substrates of the first embodiment is completed as described above.

Figure 8:
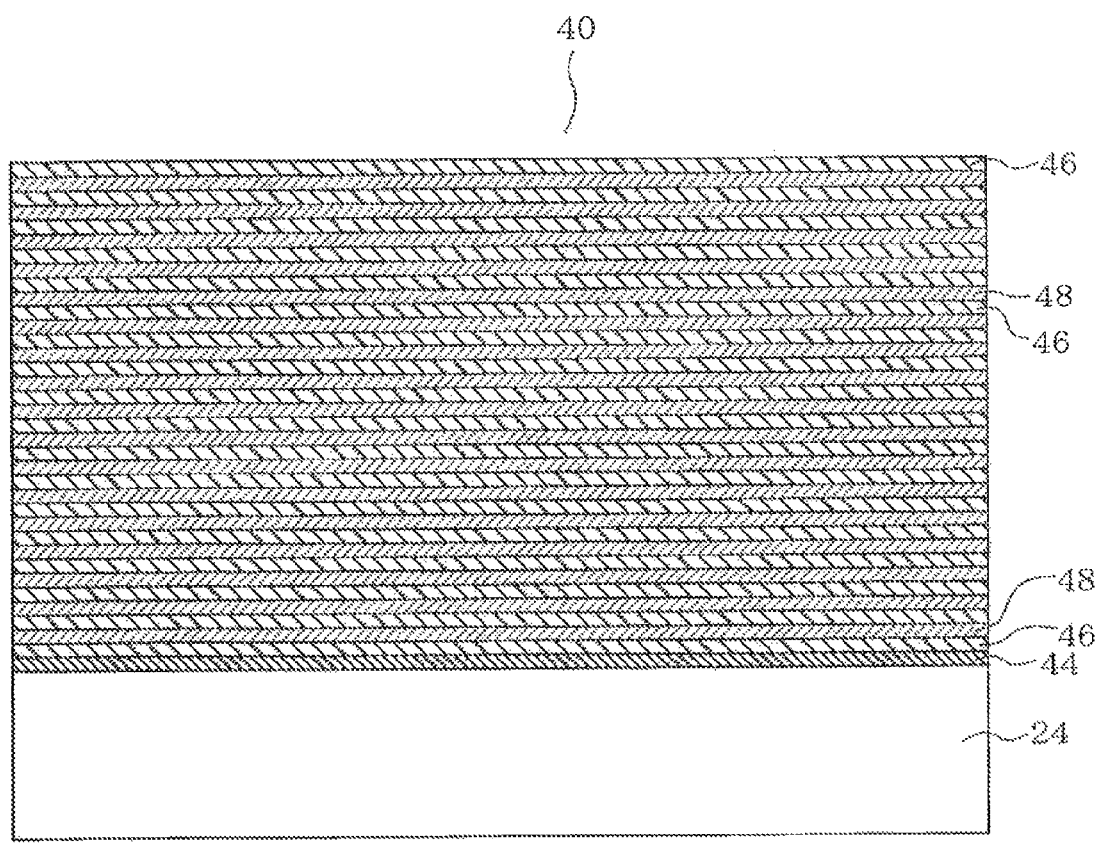
FIG. 8 is one example of a vertical cross-sectional view of the semiconductor substrates having been subjected to a processing of the first embodiment.

FIG. 8 is one example of a vertical cross-sectional view of semiconductor substrate 24 having been subjected to the above described process. As illustrated in FIG. 8, semiconductor 24 has liner film 44 and structures formed by the above described process disposed above liner film 44. More specifically, a stack of silicon oxide films 46 and tungsten films 48 formed alternately in first film forming chamber 12 and second film forming chamber 14 are formed above semiconductor substrate 24 lined by liner film 44. FIG. 8 illustrates an example in which 17 layers of silicon oxide films 46 and 17 layers of tungsten film 48 are stacked alternately. An extra silicon oxide film 46 is formed above the uppermost tungsten film 48. The number of layers of the stack is predetermined. The stack structure described and illustrated in this example may be used for example in a three-dimensional stacked flash memory in which memory cells are disposed in a three-dimensional matrix.

As described above, in semiconductor manufacturing apparatus 10 of the first embodiment, semiconductor substrates 24 may be interchanged easily between first film forming chamber 12 and second film forming chamber 14 by using turn table 20 provided with the rotary mechanism and the lifting and lowering mechanism. Turn table 20 is disposed below first film forming chamber 12 and second film forming chamber 14. Further, turn table 20 is disposed inside transition chamber 18 connected to first film forming chamber 12 and second film forming chamber 14 and thus, it is possible to interchange semiconductor substrates 24 inside transition chamber 18 maintained in a depressurized ambient. Thus, semiconductor substrates 24 can be interchanged easily since semiconductor substrates 24 are simply transferred between first film forming chamber 12, second film forming chamber 14, and transition chamber 18. The inlet/outlet port for semiconductor substrate 24, provided at the lower portion of first film forming chamber 12 and the lower portion of second film forming chamber 14, can be placed in an airtight state with ease by utilizing the wafer stage 22 and seal member 34. This also facilitates the interchanging of semiconductor substrates 24. The use of semiconductor manufacturing apparatus 10 structured as described above improves throughput of film formation in semiconductor substrate 24 when performing consecutive execution of film forming processes employing different methodologies and/or different conditions.

Figure 5A:
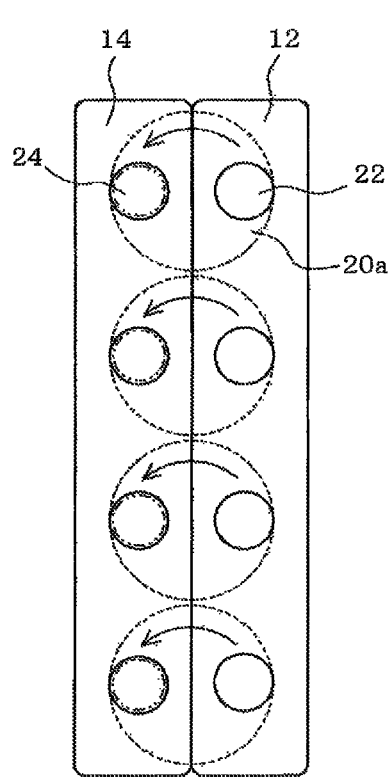
FIGS. 5A and 5B illustrate modified examples of turn tables.
Figure 5B:
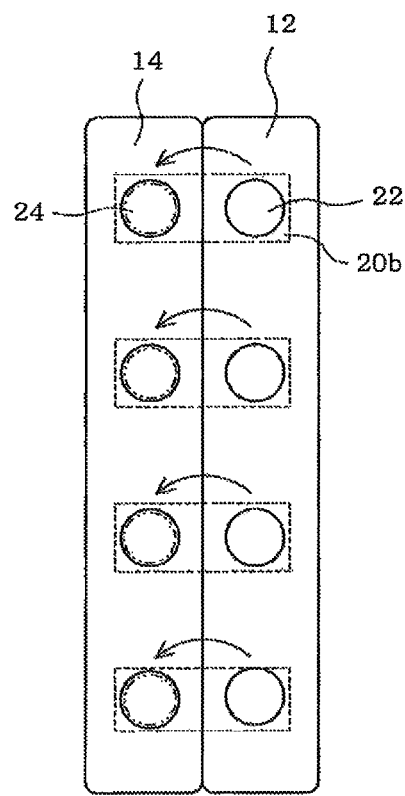

FIGS. 5A and 5B illustrate modified examples of turn table 20. Turn table 20 may be a round turn table 20a as illustrated in FIG. 5A or a rectangular turn table 20b as illustrated in FIG. 5B. Both turn tables 20a and 20b have table shafts 32 connected to their centers. The rotation mechanism and the lifting and lowering mechanism of each table shaft 32 enables the rotation and the lifting/lowering of turn tables 20a and 20b.

FIGS. 6A to 6D are examples of plan views looking down on semiconductor manufacturing apparatus 10. A description will be given on the operation and movement of turn table 20 and semiconductor substrates 24 at the beginning of the film forming process with reference to FIGS. 6A to 6D. A description will be given hereinafter through an example in which a round (circular) turn table 20a is used. Only the relevant portions are illustrated in FIGS. 6A to 6D since the rest of the structures of semiconductor manufacturing apparatus 10 remain substantially identical to those already described. Referring to FIG. 6A, first film forming chamber 12 and second film forming chamber 14 are disposed next to one another. Multiple turn tables 20 are provided below first and second film forming chambers 12 and 14. Though not illustrated, transfer chamber 16 is disposed to the right side of first film forming chamber 12 as viewed in the figures. Turn tables 20 are disposed inside transition chamber 18 not illustrated.

Referring to FIG. 6B, semiconductor substrates 241 are loaded by arm robot 26 from transfer chamber 16 located in the right side as viewed in FIG. 6B. This corresponds to the operation described above with reference to FIG. 2A. Next, turn tables 20 are lifted and CVD film is formed above each semiconductor substrate 241. This corresponds to the operation described above with reference to FIG. 2B. Next, turn tables 20 are lowered. This corresponds to the operation described above with reference to FIG. 2C. Referring next to FIG. 6C, turn tables 20 are turned to locate semiconductor substrates 241 below second film forming chamber 14. This corresponds to the operation described above with reference to FIG. 3A.

Referring next to FIG. 6D, semiconductor substrates 242 are loaded by arm robot 26 from transfer chamber 16 located in the right side as viewed in FIG. 6D. This corresponds to the operation described above with reference to FIG. 3B. Then, the processes performed in first film forming chamber 12 and second film forming chamber 14 are repeated alternately as described earlier. In this example, the second batch of wafers are carried onto the turn tables from the transfer chamber after film formation of the first batch of wafers are completed and thereafter placed below the subsequent chamber by the turn tables. Alternatively, both the first and the second batch of wafers may be placed on the turn tables at the same time and the film formation may be performed in sequence to obtain the desired stack structure.

FIGS. 7A to 7D are examples of plan views looking down on semiconductor manufacturing apparatus 10. A description will be given on the operation and movement of turn tables 20 and semiconductor substrates 24 at the end of the film forming process with reference to FIGS. 7A to 7D. A description will be given hereinafter through an example in which a round (circular) turn table 20a is used as was the case in the description given based on FIGS. 6A to 6D. A description is given hereinafter with an assumption that film formation of semiconductor substrate 24 begins for example with the film formation performed in first film forming chamber 12 and ends with the film formation performed in first film forming chamber 12 after repeating the film formation in first and second film formation chambers 12 and 14.

FIG. 7A illustrates the state in which the intended film formation is completed for semiconductor substrates 241 located in the right side of the figure. More specifically, FIG. 7A illustrates the state in which film formation in first film forming chamber 12 and film formation in second film forming chamber 14 have been repeated for scheduled number of times and the final film formation process in the first film forming chamber 12 has been completed for semiconductor substrates 241. Semiconductor substrates 242, on the other hand, have been subjected to repeated film formation processes but is yet to be subjected to the final film formation process in first film forming chamber 12. Turn tables 20 are lowered after film formation in first film forming chamber 12 is completed and semiconductor substrates 241 are unloaded in the direction indicated by the arrow illustrated in FIG. 7B by arm robot 26.

Referring next to FIG. 7C, turn tables 20 are rotated to place semiconductor substrates 242 below first film forming chamber 12. Then, turn tables 20 are lifted and semiconductor substrates 242 are subjected to the film forming process performed in first film forming chamber 12. Then, turn tables 20 are lowered and semiconductor substrates 242 are unloaded in the direction indicated, by the arrow in FIG. 7D. Film formation for semiconductor substrates 241 and 242 are completed as described above.

(Second Embodiment)

Figure 9:
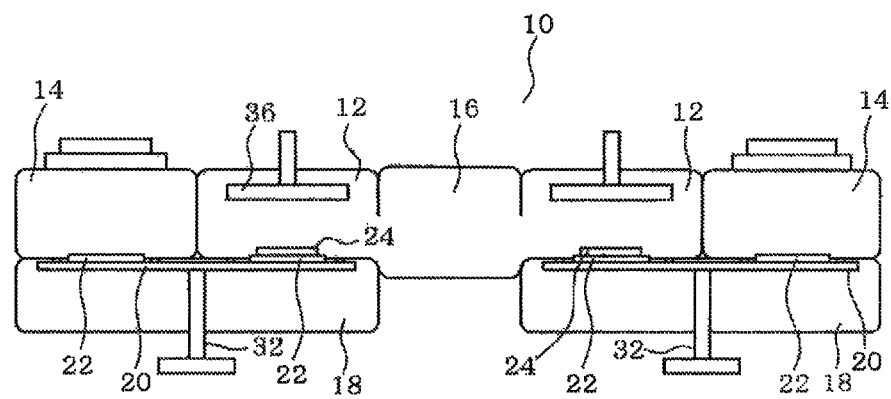
FIG. 9 pertains to a second embodiment and is one example of a view illustrating the overall structure of a semiconductor manufacturing apparatus.

FIG. 9 pertains to a second embodiment and illustrates the overall structure of semiconductor manufacturing apparatus 10. Elements that are identical to those of the first embodiment are described with identical reference symbols and are not re-described. In semiconductor manufacturing apparatus 10 illustrated in FIGS. 1A and 1B of the first embodiment, transfer chamber 16 is connected to transition chamber 18. In contrast, transfer chamber 16 is connected to first film forming chamber 12 in semiconductor manufacturing apparatus 10 of the second embodiment illustrated in FIG. 9. Other structures of the semiconductor manufacturing apparatus 10 of the second embodiment remain the same from those of the first embodiment. FIG. 9 illustrates a gate valve disposed between transfer chamber 16 and first film forming chamber 12 in the opened state. The above described structure allows semiconductor substrates 24 to be loaded directly from transfer chamber 16 to first film forming chamber 12. Thus, it is possible to start the film forming process as soon as semiconductor substrates 24 are loaded into first film forming chamber 12. As a result, it is possible to improve the throughput of film formation for semiconductor substrates 24.

(Third Embodiment)

Figure 10:
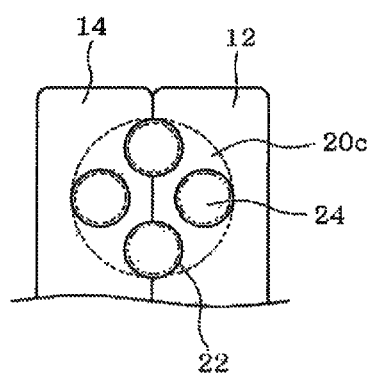
FIG. 10 pertains to a third embodiment and is one example of a view illustrating a turn table.

FIG. 10 pertains to a third embodiment and illustrates turn table 20c. Elements identical to those of the first and the second embodiments are identified with identical reference symbols and are not re-described. Turn table 20c illustrated in FIG. 10 is provided for example with four wafer stages 22. Thus, it is possible to alternately load semiconductor substrates 24 into first film forming chamber 12 and second film forming chamber 14 disposed adjacent to one another so that, for example, two semiconductor substrates 24 are subjected to film formation process while the remaining two semiconductor substrates 24 are placed in standby. More specifically, semiconductor substrates 24 maybe interchanged by simply rotating turn table 20c by 90 degrees. It is thus, possible to improve the throughput of the film forming process.

It is further possible to clean the chambers in a CVD process or execute dummy sputtering in a PVD process by placing dummy wafers in two of the four wafer stages 22 and loading the dummy wafers into first film forming chamber 12 and second film forming chamber 14. Because it is possible to execute processes such as cleaning and dummy sputtering during consecutive execution of film forming processes, it is possible to improve the properties of the films being formed.

(Fourth Embodiment)

Figure 11A:
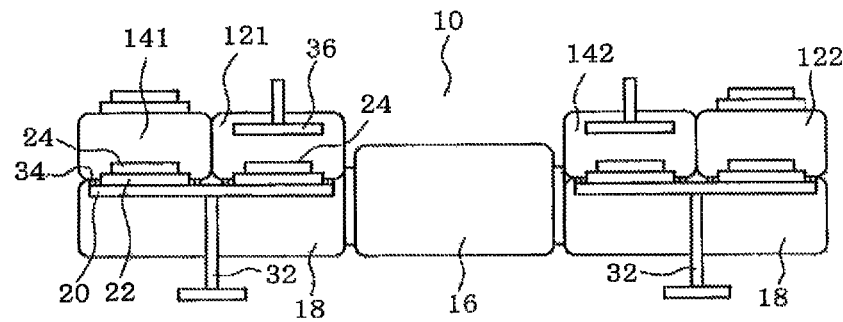
FIG. 11A pertains to a fourth embodiment and is one example of a vertical cross-sectional side view illustrating the structure of a semiconductor manufacturing apparatus.
Figure 11B:
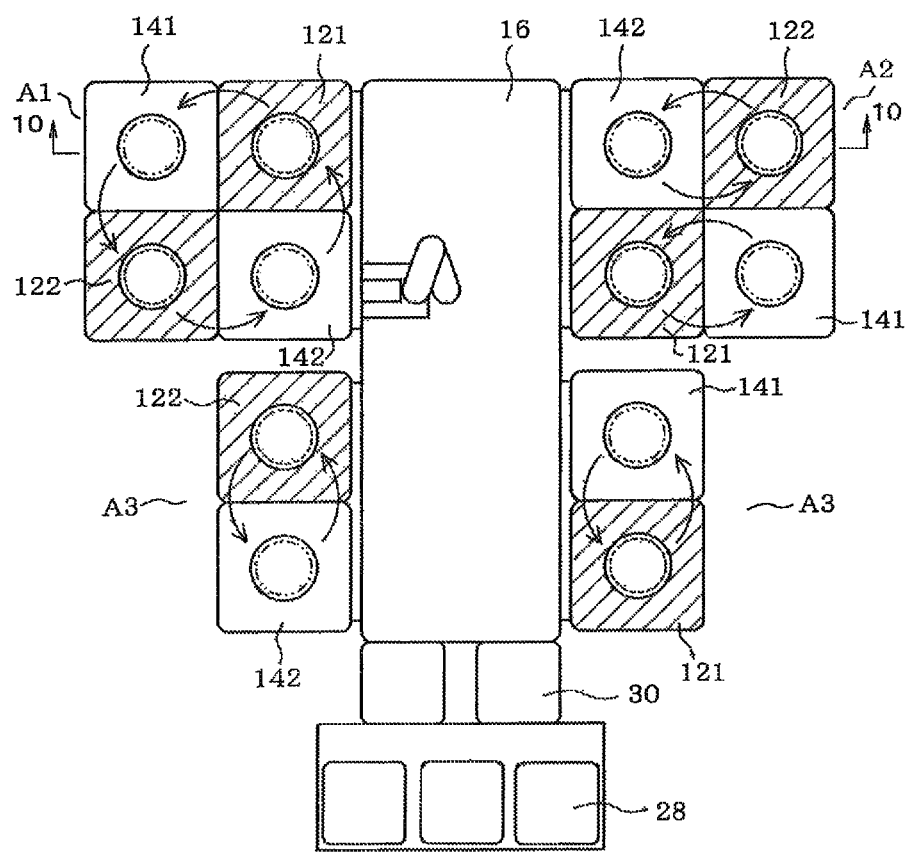
FIG. 11B pertains to the fourth embodiment and is one example of an upper surface view of the semiconductor manufacturing apparatus.

FIGS. 11A and 11B pertain to the fourth embodiment and illustrate the structures of semiconductor manufacturing apparatus 10. Elements identical to those of the first, the second, and the third embodiments are identified with identical reference symbols and are not re-described. FIG. 11A is a vertical cross-sectional side view of semiconductor manufacturing apparatus 10 taken along line 10-10 of FIG. 11B. FIG. 11B provides a top view of semiconductor manufacturing apparatus 10. As illustrated in FIG. 11B, semiconductor manufacturing apparatus 10 of the fourth embodiment is provided with transfer chamber 16, load lock chamber 30 connected to transfer chamber 16, and load port 28 as was the case in the first embodiment. First film forming chambers, represented by reference symbols 121 and 122, and second film forming chambers, represented by reference symbols 141 and 142 are disposed on the two opposing sides of transfer chamber 16. The fourth embodiment differs from the first embodiment in that first film forming chamber and the second film forming chamber are disposed alternately like a checker board as distinguished by shaded and non-shaded patterns in FIG. 11B.

Further in the fourth embodiment, semiconductor substrate 24 is transferred in a different manner as compared to the first embodiment. In the fourth embodiment, first film forming chambers 121 and 122 and second film forming chambers 141 and 142 form a group such as groups A1, A2, and A3 illustrated in FIG. 11B. For example, in group A1, the chambers are disposed alternately like a checker board in the order of first film forming chamber 121, second film forming chamber 141, first film forming chamber 122, and second film forming chamber 142 so as to as be arranged in a circle when viewed counterclockwise.

In group A1 illustrated in FIG. 11B, semiconductor substrates 24 placed on wafer stages 22 by arm robot 26 are transferred so as to leave a circular path from first film forming chamber 121, second film forming chamber 141, first film forming chamber 122, and second film forming chamber 142. As a result, it is possible to perform film formation in first film forming chamber 121/122 and second film forming chamber 141/142 in an alternate manner.

Further, in the fourth embodiment, semiconductor substrates 24 placed on wafer stages 22 may be transferred like a pendulum between first film forming chamber 121 and second film forming chamber 141 and between first film forming chamber 122 and second film forming chamber 142 as illustrated in group A2 of FIG. 11B. As a result, it is possible to perform alternate film formation in first film forming chamber 121 and second film forming chamber 141 as well as in first film forming chamber 122 and second film forming chamber 142.

Further, groups A3 of FIG. 11B illustrate an example of a checker board arrangement in which first film forming chamber 121 and second film forming chamber 141 are located on the right side of transfer chamber 16 and first film forming chamber 122 and second film forming chamber 142 are located on the left side of transfer chamber 16. Group A3 on the right side of transfer chamber 16 includes a pair of first film forming chamber 121 and second film forming chamber 141 arranged vertically adjacent to one another as viewed in FIG. 11B. Similarly, group A3 on the left side of transfer chamber 16 includes a pair of first film forming chamber 122 and second film forming chamber 142 arranged vertically adjacent to one another as viewed in FIG. 11B. In this example, semiconductor substrates 24 placed on wafer stages 22 may be transferred like a pendulum between first film forming chamber 121 and second film forming chamber 141 and between first film forming chamber 122 and second film forming chamber 142. As a result, it is possible to perform alternate film formation in first film forming chamber 121 and second film forming chamber 141 as well as in first film forming chamber 122 and second film forming chamber 142. The above described structure of fourth embodiment is capable of providing effects similar to those of the first embodiment.

(Fifth Embodiment)

FIGS. 12A to 12C and FIGS. 13A to 13C pertain to a fifth embodiment and illustrate semiconductor manufacturing apparatus 10. Elements identical to those of the first to fourth embodiment are identified with identical reference symbols and will not be re-described. In semiconductor manufacturing apparatus 10 of the fifth embodiment, wafer stage 22 and its lifting and lowering mechanism are structurally independent of turn table 20. More specifically, wafer stages 221 and 222 are provided with stage shafts 331 and 332 respectively that serve as dedicated lifting and lowering mechanisms. The wafer stage is identified as wafer stage 22 when referring to a wafer stage in general and as wafer stage 221 and wafer stage 222 when referring to specific wafer stages. Similarly, the semiconductor substrate is identified as semiconductor substrate 24 when referring to a semiconductor substrate in general and as semiconductor substrates 241 and 242 when referring to specific semiconductor substrates.

Figure 12A:
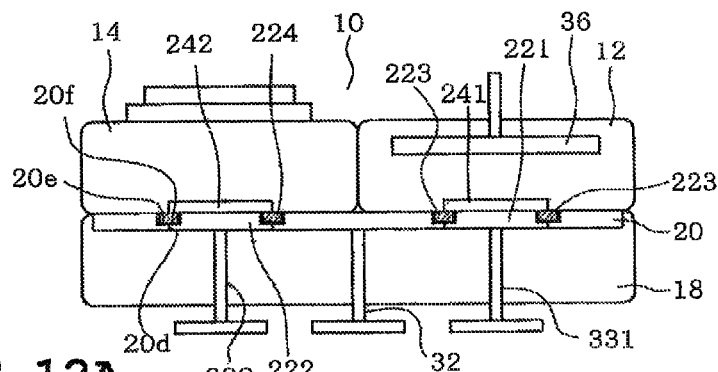
FIGS. 12A, 12B, and 12C are examples of views illustrating the operation of a fifth embodiment.

Turn table 20 is provided with through hole 20d and wafer stage 22 is configured to move in and out of through hole 20d. Counter bores 20e and 20f are provided in the upper surface of turn table 20 and in wafer stage 22 for placement of edge rings 223 and 224. Edge rings 223 and 224 are shaped like a ring. The portions of edge rings 223 and 224 that contact the film forming chambers are formed of an elastic material as was the case in corrosion-resistant seal members 34 described earlier. Edge rings 223 and 224 are not secured to either of turn table 20, wafer stage 22, first film forming chamber 12, and second film forming chamber 14. Counter bores 20e and 20f cooperate to form a single groove. Edge rings 223 and 224 are each disposed in each of the grooves as illustrated in FIG. 12A. The width of each of edge rings 223 and 224 is specified so as to be slightly less than the sum of the lengths of counter bores 20e and 20f to provide play within the groove formed of counter bores 20e and 20f. Edge rings 223 and 224 are disposed in the associated grooves so as to cover the boundary of turn table 20 and wafer stage 22. The upper surfaces of edge rings 223 and 224 disposed within the grooves slightly project with respect to the upper surfaces of turn table 20 and wafer stage 22. Thus, when turn table 20 and wafer stage 22 are lifted, edge rings 223 and 224 are pressed against the under surfaces of first film forming chamber 12 and second film forming chamber 14. As a result, first film forming chamber 12 and second film forming chamber 14 are sealed, airtight by the intimate contact with edge rings 223 and 224, covering the boundaries therebetween.

The diameter of through hole 20d is greater than the diameter of wafer stage 22. The diameter of through hole 20d is less than the outer diameters of edge rings 223 and 224 and greater than the inner diameters of edge rings 223 and 224. The diameter of wafer stage 22 is greater than the inner diameters of edge rings 223 and 224 and less than the outer diameters of edge rings 223 and 224. The boundary of turn table 20 and wafer stage 22 is located substantially in the middle of the width dimension of edge rings 223 and 224. Thus, while wafer stage 22 is capable of passing through through hole 20d, it is not possible for semiconductor substrate 24 to pass through through hole 20d because of the presence of edge rings 223 and 224. When wafer stage 22 is lowered (or when turn table 20 is lifted), wafer stage 22 passes through through hole 2d while edge rings 223 and 224 are left to rest on counter bore 20e of turn table 20. When wafer stage 22 is lifted (or when turn table 20 is lowered), wafer stage 22 passes through through hole 2d while edge rings 223 and 224 rest on counter bore 20f of wafer stage 22 and is lifted along with wafer stage 22. When semiconductor substrate 24 is placed on wafer stage 22, edge rings 223 and 224 are disposed below semiconductor substrate 24 and thus, semiconductor substrate 24 is moved with edge rings 223 and 224.

Next, a description will be given on the movement of semiconductor substrate 24. FIG. 12A indicates the state in which the film forming process for semiconductor substrate 24 is performed. As illustrated, semiconductor substrate 241 is placed on wafer stage 221 within first film forming chamber 12 and has just completed the film forming process in first film forming chamber 12. As illustrated, semiconductor substrate 242 is placed on wafer stage 222 within second film forming chamber 14 and the film forming process in second film forming chamber 14 is ongoing. Turn table 20 as well as wafer stages 22 are lifted to seal first film forming chamber 12 and second film forming chamber 14 with edge rings 223 and 224 pressed against the under surfaces of first and second film forming chambers 12 and 14.

Figure 12B:
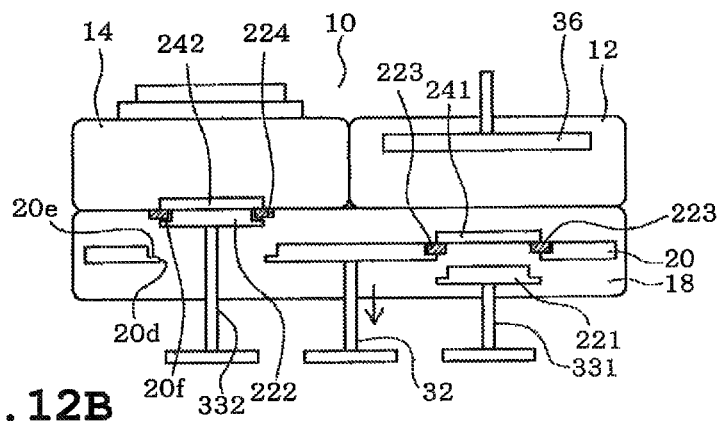
Figure 12C:
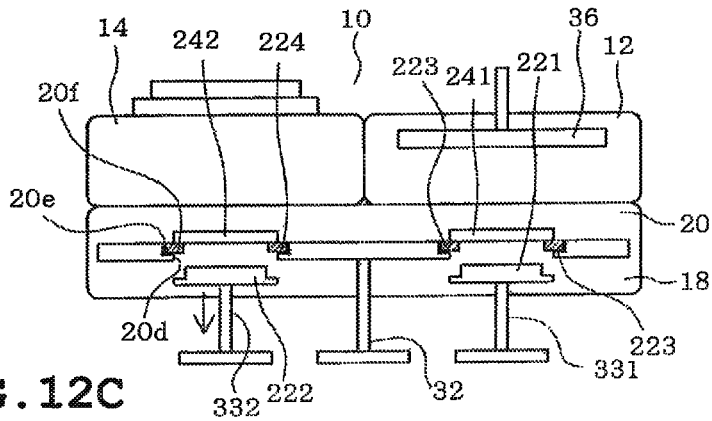

Referring next to FIG. 12B, wafer stage 221 carrying semiconductor substrate 241 is lowered with turn table 20. As a result, edge ring 223 is left to remain on counter bore 20e of turn table 20 and semiconductor substrate 241 located above edge ring 223 also remains on edge ring 223 of turn table 20. Referring next to FIG. 12C, wafer stage 222 carrying semiconductor substrate 242 is lowered to place semiconductor substrate 242 on edge ring 224 disposed on counter bore 20e of turn table 20. Wafer stages 221 and 222 pass through through holes 20d to be positioned below turn table 20.

Figure 13A:
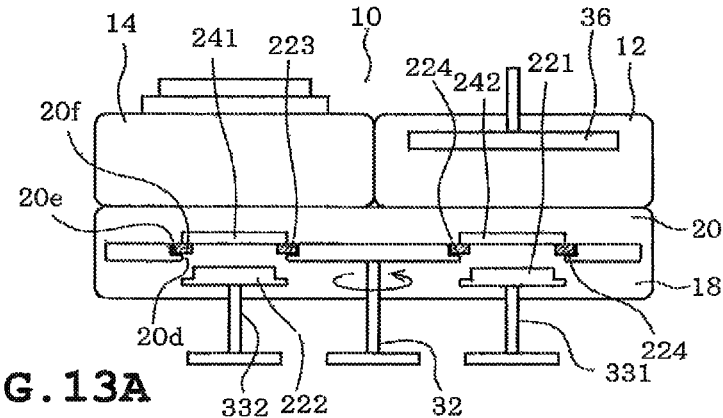
FIGS. 13A, 13B, and 13C are examples of views illustrating the operation of the fifth embodiment.

Referring next to FIG. 13A, turn table 20 is turned by 180 degrees by rotating table shaft 32. As a result, the positions of semiconductor substrates 241 and 242 are interchanged to place semi conductor substrate 242 on counter bore 20e in the right side of turn table 20 as viewed in FIG. 13A and to place semiconductor substrate 241 on counter bore 20e in the left side of turn table 20 as viewed in FIG. 13A.

Figure 13B:
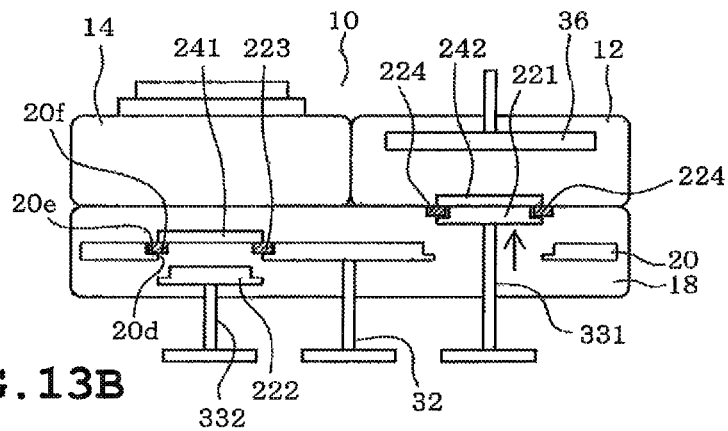
Figure 13C:
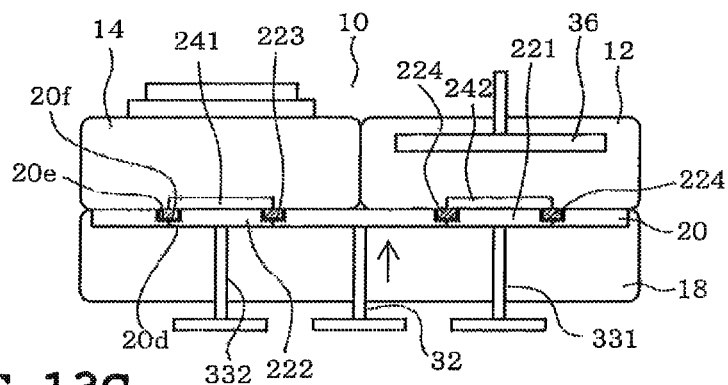

Referring next to FIG. 13B, semiconductor substrate 242 is lifted into first film forming chamber 12 by lifting wafer stage 221. Referring next to FIG. 13C, semiconductor substrate 241 is lifted into second film forming chamber 14 by lifting wafer stage 222 with turn table 20. Then, semiconductor substrate 242 is subjected to film forming process in first film forming chamber 12 and semiconductor substrate 241 is subjected to film forming process in second film forming chamber 14.

In the fifth embodiment, the turn table, in addition to the wafer stages, is lifted/lowered depending upon the process being performed. Alternatively, the position and the height of the turn table may be maintained for example as illustrated in FIG. 13A and the wafer may be loaded/unloaded by the lifting/lowering of the wafer stage alone. It is thus, possible to reduce the number of operations and mechanisms. The fifth embodiment is also capable of introducing inert gas from a gas supplier mechanism not illustrated disposed at the wafer stage and the edge rings in order to prevent film deposition along the rear surface and the bevel of the wafer during film formation and to protect the portions sealed airtight described above.

Transfer chamber 16 is not illustrated in the figures referred to in the fifth embodiment. However, transfer chamber 16 may be connected to transition chamber 18 as was the case in semiconductor manufacturing apparatus 10 illustrated in FIG. 1 or be connected to first film forming chamber 12 as was the case in semiconductor manufacturing apparatus 10 illustrated in FIG. 9. Further, in the examples illustrated in FIGS. 12B, 12C, 13B, and 13C, wafer stages 221 and 222 are moved independent of one another. Alternatively, wafer stages 221 and 222 may be lifted/lowered in synchronism.

In the fifth embodiment described above, it is possible to provide dedicated wafer stage 221 and wafer stage 222 for first film forming chamber 12 and second film forming chamber 14, respectively. For example, when first film forming chamber 12 serves as a sputtering apparatus and second film forming chamber 14 serves as a CVD apparatus, wafer stages 221 and 222 are configured to be capable of being used in both first film forming chamber 12 and second film forming chamber 14 in the first embodiment since the wafer stages 221 and 222 of the first embodiment are moved along with the rotation of turn table 20. However, in the fifth embodiment, wafer stage 221 is used in first film forming chamber 12 alone and thus, may be designed to possess structures and functionalities that are suitable for such usage. Similarly, wafer stage 222 is used in second film forming chamber 14 alone and thus, may be designed to possess structures and functionalities that are suitable for such usage. To summarize, it is possible to configure wafer stages 221 and 222 so as to be suitable for use in each type of film forming apparatus. This improves the flexibility of the apparatus as well as the stability of the process and therefore contributes in forming high quality films.

Further, in the fifth embodiment, it is possible to unload semiconductor substrate 241 processed in first film forming chamber 12 and semiconductor substrate 242 processed in second film forming chamber 14 independently. For example, semiconductor substrate 241 processed in first film forming chamber 12 may be unloaded before unloading semiconductor substrate 242 processed in second film forming chamber 14 when the process time of first film forming chamber 12 is less than the process time of second film forming chamber 14. It is thus, possible to close the opening/closing member not illustrated of inlet/outlet port provided in first film forming chamber 12 and make adjustments in the ambient, pressure, etc. inside first film forming chamber 12 before loading the next semiconductor substrate 24. Moreover, such adjustments can be made while processing of semiconductor substrate 242 in second film forming chamber 14 is ongoing. It is also possible to process the next semiconductor substrate 24 in second film forming chamber 14 while adjustments are being made in the ambient, etc. in first film forming chamber 12. Likewise, when adjustments in the ambient, etc. need to be made in second film forming chamber 14, semiconductor substrate 24 may be introduced into first film forming chamber 12 and be subjected to film forming process while making adjustments in the ambient, etc. in second film forming chamber 14. Because semiconductor substrates 24 can be loaded to/unloaded from each film forming apparatus (chambers) independently, it is possible to improve process flexibility as described above. It is further possible to utilize the idle time resulting from the difference in the process time of each film forming apparatus and thereby reduce time expended on pressure adjustment between the film forming chambers and the wafer transition chamber, which in turn contributes in improving the overall throughput.

(Other Embodiments)

Embodiments described above may be applied to various types of semiconductor devices a NAND or a NOR-type flash memory, EPROM, DRAM, SRAM, other types of semiconductor storage devices, or various types of logic devices, and to manufacturing process steps of the foregoing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device using a semiconductor manufacturing apparatus including a turn table configured to allow placement of at least a first semiconductor substrate and a second semiconductor substrate and configured to be capable of moving positions of the first semiconductor substrate and the second semiconductor substrate by turning, a first film forming chamber, and a second film forming chamber, the first film forming chamber and the second film forming chamber each being provided with an opening configured to be capable of loading and unloading the first semiconductor substrate and the second semiconductor substrate by lifting and lowering of the first semiconductor substrate and the second semiconductor substrate placed on the turn table, the method comprising:

transferring the first semiconductor substrate and the second semiconductor substrate between the first film forming chamber and the second film forming chamber by turning the turn table and lifting and lowering the first semiconductor substrate and the second semiconductor substrate placed on the turn table; and forming a stack of films above the first semiconductor substrate and the second semiconductor substrate.

2. The method according to claim 1, wherein film formation in the first film forming chamber is performed in an oxidizing ambient and film formation in the second film forming chamber forms an oxidizable material.

3. The method according to claim 2, wherein the oxidizable material comprises a metal which is oxidized when exposed to an oxidizing ambient.

4. The method according to claim 3, wherein the metal is at least one material selected from a group consisting of Al, Co, Cu, Hf, Ir, Mo, Ni, Pd, Pt, Ru, Si, Ta, Ti, W, WNx, MoNx, NiSix, and NiSiNx.

5. A semiconductor manufacturing apparatus comprising:
a turn table configured to allow placement of at least a first semiconductor substrate and a second semiconductor substrate and configured to be capable of moving positions of the first semiconductor substrate and the second semiconductor substrate by turning;
a first film forming chamber, and a second film forming chamber, the first film forming chamber and the second film forming chamber each being provided with an opening configured to be capable of loading and unloading the first semiconductor substrate and the second semiconductor substrate by lifting and lowering of the first semiconductor substrate and the second semiconductor substrate placed on the turn table;
a transition chamber configured to store the turn table; and
a transfer chamber connected to the transition chamber or to at least either of the first film forming chamber and the second film forming chamber.

6. The apparatus according to claim 5, wherein at least either of the first film forming chamber and the second film forming chamber is configured to be capable of setting a pressure inside thereof to be greater than a pressure inside the transition chamber.

7. The apparatus according to claim 5, wherein either of the first film forming chamber and the second film forming chamber is a film forming chamber of a chemical vapor deposition apparatus and the remaining other is a film forming chamber of a sputtering apparatus.

8. The apparatus according to claim 5, wherein the turn table includes a rotary shaft being provided with a lifting and lowering mechanism configured to lift and lower the turn table.

9. The apparatus according to claim 8, further comprising a first seal member and a second seal member each formed of a ring shaped like a letter O, the first seal member being disposed at an under surface of the first film forming chamber and the second seal member being disposed at an under surface of the second film forming chamber, wherein the first seal member and the second seal member are configured to contact an upper surface of the turn table when the turn table is lifted, thereby placing the first film forming chamber and the second film forming chamber in an airtight state.

10. The apparatus according to claim 5, further comprising at least a first stage and a second stage each provided with a lifting and lowering mechanism, the first stage being configured to allow placement of the first or the second semiconductor substrate and the second stage being configured to allow placement of the first or the second semiconductor substrate, wherein the turn table and each of the first stage and the second stage are structurally independent, the turn table includes a first through hole configured to allow passage of the first or the second stage, a second through hole configured to allow passage of the first or the second stage, and a first ring and a second ring are equipped to be placed on an upper surface of the turn table so as not to be fixed to any component, diameters of the first through hole and the second through hole being less than outer diameters of the first ring and the second ring and greater than inner diameters of the first ring and the second ring.

11. The apparatus according to claim 10, wherein the turn table is configured to be capable of rotating when the first stage and the second stage are disposed below the turn table.

12. The apparatus according to claim 5, wherein the first film forming chamber and the second film forming chamber are film forming chambers of a chemical vapor deposition apparatus.

13. The apparatus according to claim 5, wherein the first film forming chamber and the second film forming chamber are film forming chambers of a sputtering apparatus.

14. The apparatus according to claim 5, wherein the transfer chamber is connected to the transition chamber, and each of the first film forming chamber, the second film forming chamber, the transition chamber, and the transfer chamber is controlled to a depressurized ambient.

15. The apparatus according to claim 5, wherein the transfer chamber is connected to the first film forming chamber or the second film forming chamber, and each of the first film forming chamber, the second film forming chamber, the transition chamber, and the transfer chamber is controlled to a depressurized ambient.

16. The apparatus according to claim 5, wherein the turn table includes a stage configured to allow placement of a semiconductor substrate.

* * * * *